June 3, 1958 H. J. GEISLER 2,837,641

RADIO FREQUENCY ACTUATED TRANSFER RELAY

Filed Oct. 1, 1953 4 Sheets-Sheet 1

INVENTOR.
HELMUT JOHN GEISLER

BY William V. Schelberg
AGENT

June 3, 1958 H. J. GEISLER 2,837,641

RADIO FREQUENCY ACTUATED TRANSFER RELAY

Filed Oct. 1, 1953 4 Sheets-Sheet 2

INVENTOR.
HELMUT JOHN GEISLER

BY William V. Schelberg
AGENT

RADIO FREQUENCY ACTUATED TRANSFER RELAY

Filed Oct. 1, 1953 4 Sheets-Sheet 3

INVENTOR
HELMUT JOHN GEISLER
BY William V. Schelberg
AGENT

June 3, 1958 H. J. GEISLER 2,837,641

RADIO FREQUENCY ACTUATED TRANSFER RELAY

Filed Oct. 1, 1953 4 Sheets-Sheet 4

INVENTOR
HELMUT JOHN GEISLER
BY William V. Schelberg
AGENT

United States Patent Office 2,837,641

Patented June 3, 1958

2,837,641

RADIO FREQUENCY ACTUATED TRANSFER RELAY

Helmut John Geisler, Wappingers Falls, N. Y., assignor to International Business Machines Corporation, New York, N. Y., a corporation of New York Application October 1, 1953, Serial No. 383,680

23 Claims. (Cl. 250—27)

This invention relates to multi-contact switching systems and is directed particularly to devices which perform switching functions in response to shifting of the position of a standing wave of voltage on a transmission line or other conducting medium to accomplish this purpose.

The selection of one of two or more electrical circuits which must remain isolated from one another represents a transfer operation. Electromagnetically operated relays for transferring a plurality of circuits with a minimum of cross modulation have long been known, however, such devices provide satisfactory operation only at relatively low speeds, for example, greater than 1000 microseconds. In systems requiring operating speeds considerably beyond this range, such as those employed in electronic calculators and similar apparatus, logical And-Or circuits ar frequently employed for each transfer point with each of these logical circuits comprising a network conventionally requiring six crystal diodes.

In accordance with my invention, transfer of a multiplicity of circuits is accomplished much more economically than by methods heretofore known. For control of ten circuits, for example, one modification requires an oscillator, one terminal control tube, and twenty radio frequency actuated glow tubes in performing the equivalent function of logical circuit networks requiring as many as sixty crystal diodes.

The novel devices to be described require less than fifty microseconds for a multiple transfer operation, and, in one form, accomplishes transfer by shifting the position of the node and anti-node points of a standing voltage wave on a transmission line with reference to two groups of radio frequency actuated glow tubes displaced from one another on the transmission line a distance equal to a quarter wave length of the exciting frequency.

Modifications employing the basic principle of switching by shifting standing waves of radio frequency energy are readily apparent and a further arrangement is described with control obtained by sensing regions of current maximum (voltage minimum). This organization is operable at electronic speeds and employs radio frequency transformers at the current maximum points and sets up switching paths through diode circuitry.

In still another arrangement, the transmission line is replaced by gas filled glow tube having photo-voltaic or photo-resistive elements placed at quarter wave length intervals along the tube. Ring shaped electrodes mounted at the tube terminals serve for control elements and the material forming the photo-conductive bands is matched for response to the color of the gas filling and gives a ten to one resistive change as discrete illuminated gas regions in the tube are shifted in position.

Accordingly, an object of the present invention is to provide an economical high speed multiple transfer device.

A further object of the invention is to provide a transfer device which is responsive to shifting of the position of a standing voltage wave on an electric transmission medium.

Another object of the invention is to provide a novel shifting circuit requiring a minimum number of components and which is operable at high speeds.

Other objects of the invention will be pointed out in the following description and claims and illustrated in the accompanying drawings, which disclose, by way of example, the principle of the invention and the best mode, which has been contemplated, of applying that principle.

In the drawings:

Figs. 1*a* and 1*b* together illustrate a column shift circuit arrangement which employs transfer devices fabricated in accordance with one form of the invention.

Figure 1A:
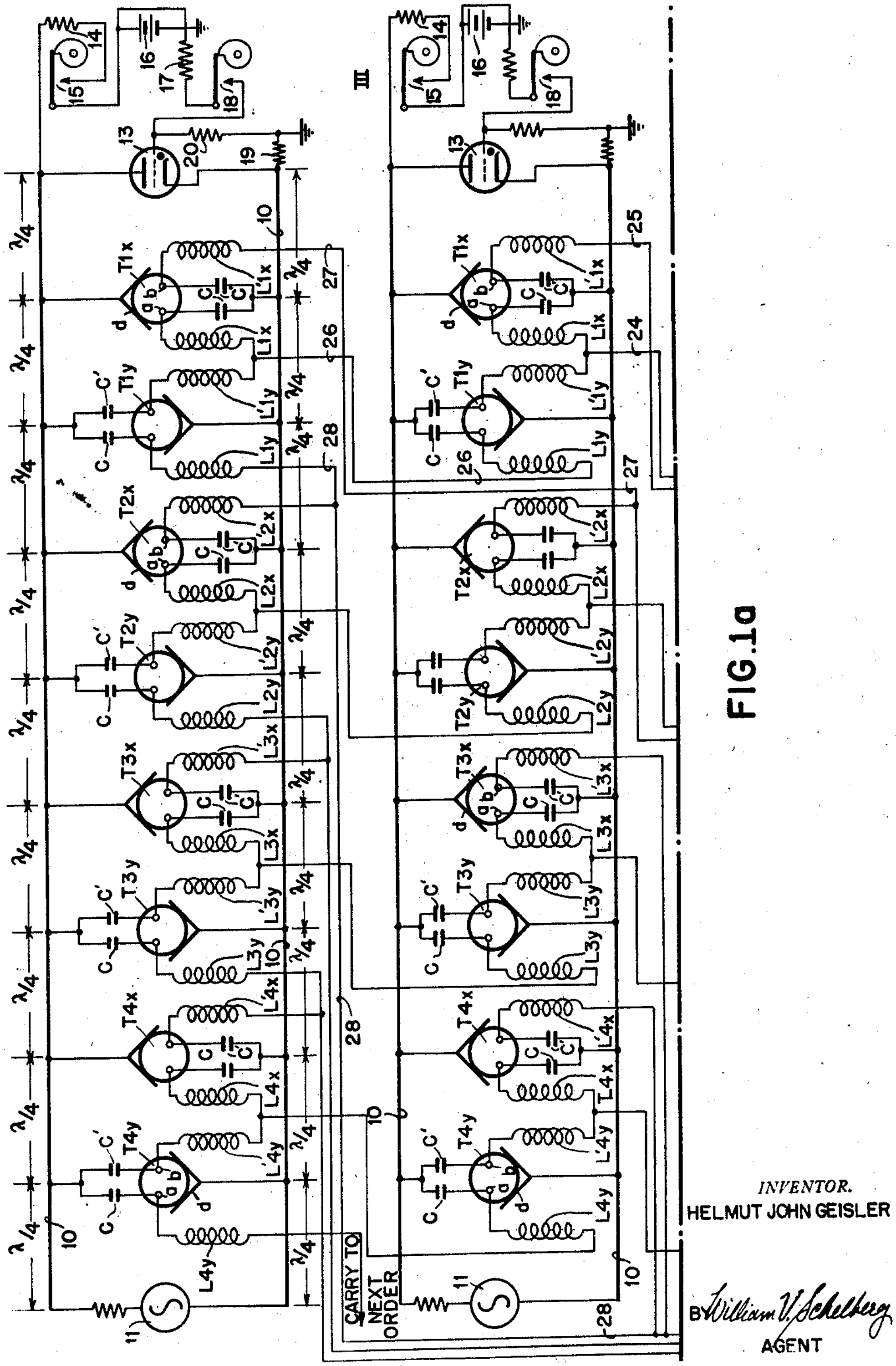
Figure 1B:
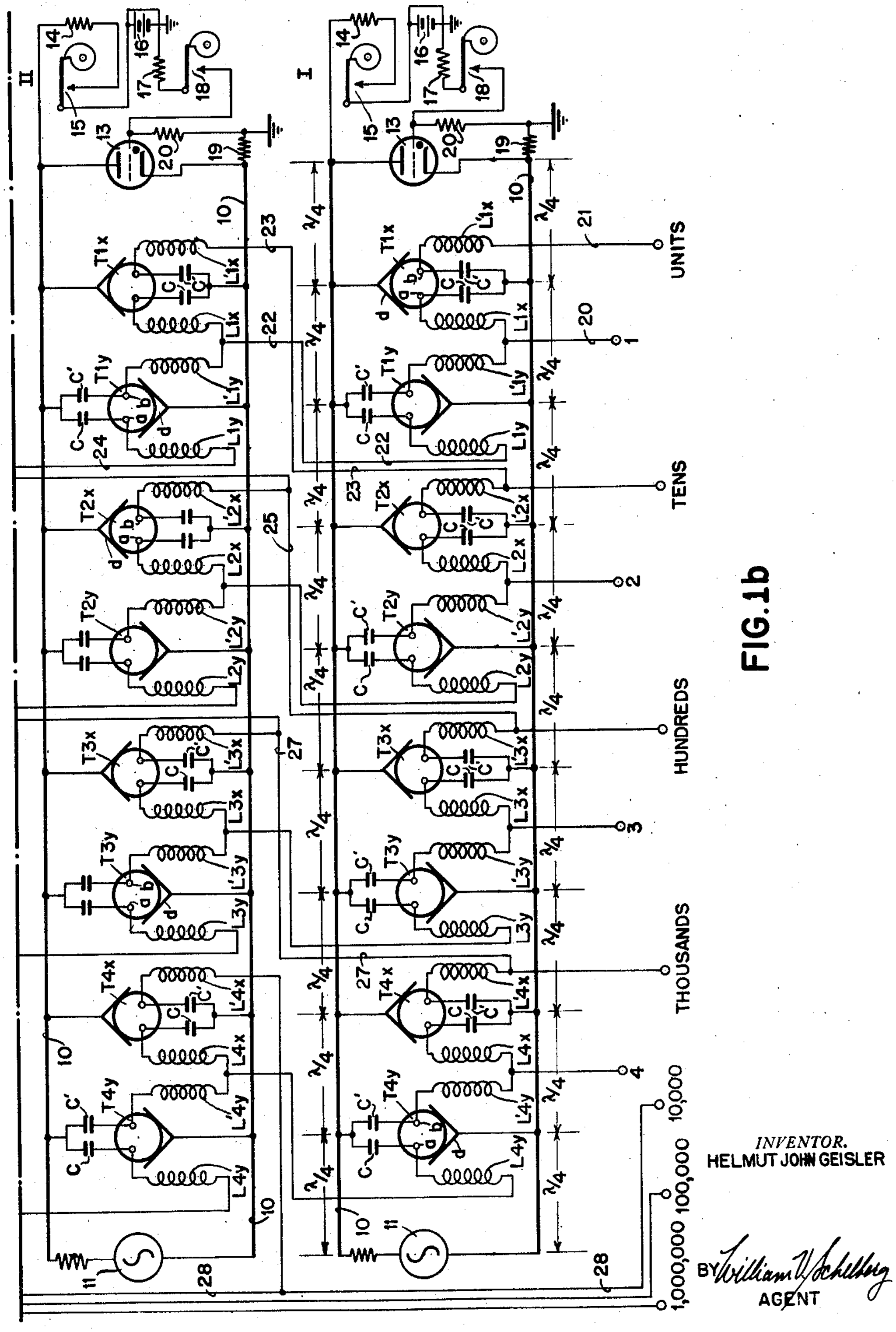

Referring to Fig. 1, four sections of transmission line 10 are illustrated with each section provided with a plurality of pairs of radio frequency actuated gas switch tubes T connected at quarter wave length intervals along its length. The switch tubes T in each bank or section of transmission line are given subscript labels corresponding to representative order positions and further subscripts $x$ and $y$ are given to distinguish between the tubes of each pair. Any number of pairs of tubes T may be employed to correspond with the number of circuits to be transferred, and any number of sections of transmission line 10 or transfer banks may be used to conform with the maximum column shift desired in any single operation. The four banks of transfer devices shown are interconnected to form a shifting circuit capable of a four place column shift. Each transmission line section 10 is energized from a conventional oscillator 11 having a continuous output of high frequency energy sufficient to supply ionizing potential to the tubes T. The transmission line is terminated by a shunt connected thyratron tube 13 which simulates either an open or shorted condition of the line 10 so as to provide standing waves whose voltage maximum positions can be shifted a distance corresponding to one quarter wave length.

The length of each transmission line section 10 is large compared to the exciting wave length of the energy supplied by oscillator 11 and the characteristic impedance of the section is low compared to the impedance of the radio frequency actuated gas tubes T. The line need not be straight as illustrated, but may be bent into any of the common shapes consistent with U. H. F. practice and the connections to the tubes T may also be made through one half wavelength stub sections rather than directly as shown. Considering, for example, a two wire transmisison line five feet in length and having a characteristic impedance of 200 ohms at a frequency of 1000 megacycles, the connections for twenty radio frequency gas tubes may be placed approximately three inches apart along the line so that alternate tubes are then separated by a distance equal to one half the wavelength of the exciting frequency.

Figure 2:
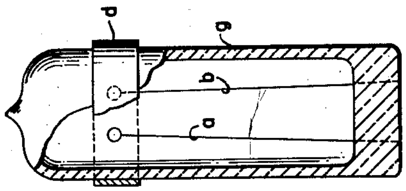
Fig. 2 illustrates a radio frequency gas switch tube such as that employed in the circuit arrangement of Fig. 1.

The radio frequency actuated gas switch tubes T are shown in detail in Fig. 2. This tube provides a simple fast acting switch device combining the desirable features of economy, good life, and insensitivity to temperature change. As shown in this figure, two electrodes $a$ and $b$ are positioned within the envelope $g$ and a third electrode $d$, comprising a conductive metal band encircles the tube envelope adjacent the ends of the electrodes. Application of radio frequency energy between the external band electrode *d* and both of the internal electrodes *a* and *b*, produces an auxiliary radio frequency discharge through the gas filling which, at this time, will allow flow of low voltage direct current between the electrodes *a* and *b* due to immersion of these electrodes in the ionized field of the radio frequency discharge.

The aforementioned thyratron 13 is located at the end of each of the transmission line sections 10 and is connected so as to short circuit the line section when conducting. The plate of tube 13 is connected through a resistor 14 and cam operated switch 15 to the positive terminal of a steady state source of voltage 16, the opposite terminal of which is grounded. The positive terminal of the source 16 is also connected through a resistor 17 and cam operated switch 18 to the grid of tube 13. The cathode and grid electrodes are connected to ground through resistors 19 and 20, respectively. Cam switches 15 and 18 are synchronously operated, as for example from the same shaft, and are adjusted so that the switches 15 and 18 are simultaneously closed to render the tube 13 conductive, and switch 15 opens to remove plate potential in deionizing the tube. As shown schematically in the figure, these switches are mechanical devices, however, they may be replaced with electronic devices operated in accordance with signals programmed from controlling signal sources within a calculator or other apparatus. When a positive pulse supplied through switch 18 ignites the tube 13, the transmission line 10 is shorted and the standing wave of energy provided by oscillator 11 has maximum voltage points which ignite the tubes T having subscript labels *x*. Opening of switch 15 causes deionization of tube 13 and the line 10 is open circuited, yielding a standing wave whose maximum voltage points ignite the tubes T having subscript labels *y*. Condensers C and C′ are connected to the internal electrodes *a* and *b* respectively of each of the radio frequency actuated gas switch tubes T in order to provide a path for the high frequency energy applied across the tubes through their connections with the transmission line. When the voltage maximum points of the standing energy wave are positioned at those points on the transmission line where the tube circuit terminals are located, radio frequency current flows from electrode *d* to electrodes *a* and *b* and the condensers C and C′ in parallel. These condensers also serve to block the flow of unidirectional energy applied to the tube electrodes *a* and *b* from a signal source. Inductance coils L and L′ are additional filter elements which function to block the flow of high frequency energy to the signal sources which are connected to electrodes *a* and *b* through these coils as will be described.

Input signals are applied to a set of terminals labeled 1, 2, 3 and 4, shown at the bottom of the figure, and are directed to one or the other of the pair of tubes T provided for each order, depending on the conductive state of tube 13 in bank I. One of two alternate paths are then provided through each bank in a manner similar to the so-called Christmas tree arrangements of electromagnetic switching relays. In employing this arrangement as a column shift device, numerical data in the form of differentially timed electrical impulses may be directed into a storage matrix or registers (not shown) at any one of a plurality of storage positions. If, for example, as in the well-known over and over addition process of multiplication, it is desired to cause a character so represented by electrical pulses to be multipled by ten, one hundred, one thousand, etc., the signal pulses are correspondingly shifted to appropriate storage positions and entered in the particular order positions a number of times as indicated by that order of the multiplier. Through the several banks of transfer devices I, II, III and IV shown in Fig. 1, multiple column shifts may readily be accomplished within a minimum of transfer time.

In their normal or non-shifting states, transfer banks II, III and IV are terminated in an open circuit with the tubes 13 for each of these banks non-conductive, and transfer bank I is terminated in a short circuit with tube 13 for this bank in a conductive state. Under such conditions, the radio frequency actuated gas tubes T having subscripts *x* in bank I are conductive and those having subscripts *y* are non-conductive, while the tubes T having subscripts *y* in banks II, III and IV are conductive and those having subscripts *x* in these banks are non-conductive. Signals applied at the terminals 1, 2, 3 and 4 then appear at output terminals labeled units, tens, hundreds, thousands, etc., respectively. Tracing the current path from terminal 1, the signal traverses a lead 20, coil $L_{1x}$, electrodes *a* and *b* of switch tube $T_{1x}$ of bank I, coil $L'_{1x}$ and then through a lead 21 to appear at the units output terminal. Current paths may be traced from each of the other input terminals 2, 3 and 4 to the tens, hundreds and thousands output terminals respectively in a similar manner.

In order to provide a one column shift to the left, the tubes 13 associated with banks I, III and IV are rendered non-conductive and the tube 13 associated with bank II is rendered conductive by operation of the associated switches 15 and 18. Under this condition, the tubes T having subscripts *x* in bank I are non-conductive, and those with subscripts *y* are conductive, while in bank II, tubes T with subscripts *x* are conductive and those with subscripts *y* are non-conductive. The flow of the signal pulse under this condition may be traced, for example, from terminal 1 through the lead 20, choke coil $L'_{1y}$, switch tube $T_{1y}$ of bank I, the choke coil $L_{1y}$, a lead 22, coil $L_{1x}$ and switch tube $T_{1x}$ of bank II, coil $L'_{1x}$, a lead 23 and finally to the tens order output terminal. Similarly, signals applied to terminals 2, 3 and 4 appear at the hundreds, thousands and ten thousands output terminals respectively.

To provide a two place column shift, the tube 13 associated with bank III is rendered conductive when those tubes 13 associated with banks I, II and IV are non-conductive. The signal pulse may now be traced from terminal 1 through the lead 20, tube $T_{1y}$ of bank I, lead 22, switch tube $T_{1y}$ of bank II, a lead 24 and thence to the tube $T_{1x}$ of bank III and through a lead 25 to the hundreds order output terminal.

To provide a three column shift, the tube 13 associated with bank IV is rendered conductive and those associated with banks I, II, and III are non-conductive. A signal pulse may now be traced from terminal 1 through lead 20, the tube $T_{1y}$ of bank I, the lead 22, tube $T_{1y}$ of bank II, the lead 24, tube $T_{1y}$ of bank III, a lead 26, tube $T_{1x}$ of bank IV, and a lead 27 to the thousands order output terminal.

To provide a four column shift, the tubes 13 of each of the banks I, II, III, and IV are rendered non-conductive so that the tubes T having subscripts *y* in each bank are conductive. The flow of signal current of input terminal 1 may now be traced through the lead 20, tube $T_{1y}$ of bank I, lead 22, tube $T_{1y}$ of bank II, lead 24, tube $T_{1y}$ or bank III, lead 26, tube $T_{1y}$ of bank IV and through a lead 28 to the ten thousands terminal.

Obviously, signals may be traced in a similar manner from each of the input terminals to correspondingly shifted ones of the output terminals, and, while only means for providing a column shift to the left is shown, shifting to the right a predetermined number of positions may also be accomplished by rendering the proper switch tubes T conductive.

Figure 3:
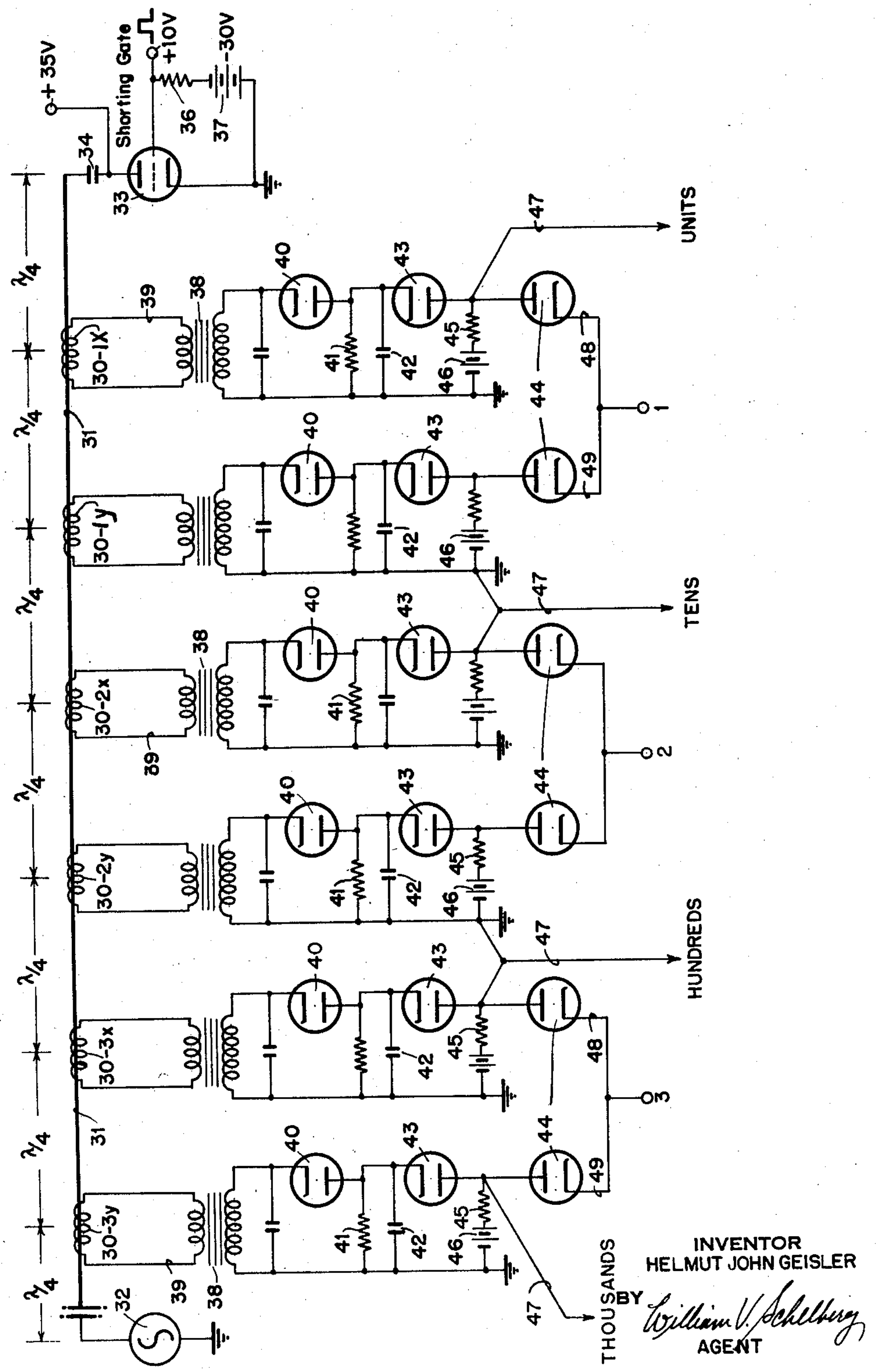
Fig. 3 illustrates another form of the transfer device in which standing wave control is obtained at points of current maximum along the length of the transmission line and which is capable of operation at electronic speeds.

A modification employing means for sensing regions of current maximum along an energized transmission line is illustrated in Fig. 3. In this embodiment only one multiple transfer section is illustrated, it being understood that any number of such sections may be employed and interconnected in the manner illustrated in Fig. 1. The arrangement shown in Fig. 3 is operable at electronic speeds and employs inductive means comprising a plurality of pairs of coils 30 positioned about a single wire transmission line 31 and spaced at quarter wavelength intervals along its length. The coils 30 are given subscript labels corresponding to representative order positions and further subscripts $x$ and $y$ are given to distinguish between coils of each pair. A source of radio frequency energy 32 is connected at one end and a vacuum tube switch 33 is coupled to the other end through a capacitor 34. The source 32 and cathode terminal of the vacuum tube switch 33 may be grounded as shown through the chassis of the equipment to provide a return path for the radio frequency energy applied to the line. The plate of tube 33 is connected to a positive source of voltage 35 and the grid is biased negatively with respect to the cathode by connection through a resistor 36 and source 37.

Only three pairs of the aforementioned coils 30 are illustrated, however, any number may be employed to correspond with the number of circuits to be transferred and any number of sections of transmission line 31 may be provided to correspond with the number of positions of column shift desired in any one single operation. Each of the aforementioned coils 30 is connected to an individual radio frequency transformer 38 by a linking circuit 39. A diode 40 and a branch circuit, comprising a parallel connected resistor 41 and capacitor 42, are connected in series across the secondary of each of the transformers 38. One side of the secondary winding is grounded as shown and the junction of the diode 40 and elements 41 and 42 provides one input for a conventional diode And circuit. This terminal is normally held at ground potential when the radio frequency transformer 38 is not energized, however, with the coil 30 associated with the transformer 38 located at a point of current maximum on the transmission line, this common terminal is lowered in potential.

The aforementioned And circuit comprises a pair of diodes 43 and 44 having their anode terminals connected through a common resistor 45 to a source of positive voltage 46. The junction of the resistor 45 and the anodes of these two diodes is connected to an output line 47 which leads to a particular output order position. The cathode of diode 43 serves as one input terminal of the And circuit, and the cathode of diode 44 serves as the other input terminal. The common terminal of diode 40 and resistor 41 is coupled to the cathode of diode 43 and this one of the And circuit input terminals is, therefore, subjected to a negative voltage swing when the associated coil 30 is energized. The other And circuit input terminal, the cathode of diode 44, is coupled to one of the terminals labeled 1, 2, 3, etc., as shown in the drawings. The And circuit develops a significant output voltage on lead 47 on application of negative voltage pulses to both inputs but does not develop an appreciable output voltage when either one of the input terminals are separately pulsed.

A pair of coils 30 and associated networks as described are provided for each one of the illustrated input terminals 1, 2, 3, etc., and alternate ones of the coils 30 are positioned at regions of current maximum along the line 31 dependent upon the conductive status of the switch tube 33. Each one of the terminals 1, 2, and 3 is coupled to one of the inputs of each pair of associated And circuits and consequently, when pulsed negatively, one input of each of the And circuits is pulsed negatively. Only one of these And circuits will produce an output voltage, however, since only one of the coils 30 of each pair will be energized and only one of the second inputs of the associated pair of And circuits will be held negative. Positive gate pulses applied to the grid of switch tube 33, therefore, cause the standing radio frequency wave to shift and alternate ones of the coils 30 of each network pair are energized with the result that alternate ones of the And circuits are activated and the output lead 47 associaed with one or the other is subjected to a negative swing when the input lead 1, 2, or 3 is pulsed. By connecting the output leads 47 of alternate networks of adjacent pairs, then the inputs on leads 1, 2, and 3 may be selectively directed to one of two order positions. These terminals are labeled units, tens, hundreds, etc.

With the switch tube 33 in a non-conductive state, the transmission line 31 is terminated in an open circuit and the coils 30 located at odd quarter wavelength distances from the end, those with $x$ subscripts, are energized. The cathodes of diodes 43 associated with these coils are held at a negative potential and those associated with the coils having $y$ subscripts are at ground potential. A negative input applied to terminal 1, for example, then is applied to the cathode of the 1$x$ network diode 44 through a lead 48 and the other input of the units order And circuit is pulsed negatively from the transformer 38 through diode 40. A negative output then appears on the associated lead 47 and the units order output terminal experiences a negative impulse equal in duration to that of the pulse applied to terminal 1. When the input pulse to terminal 1 is applied, the cathode of the diode 44 associated with the 1$y$ network is also pulled negatively, however, as the other input to this And circuit remains at ground potential since coil 30—1$y$ is not energized and there is no output on the tens order terminal due to this signal. Obviously, an input pulse applied through the other terminals 1, 2, 3, etc., may be traced in a similar manner.

To cause a shift to the left, a positive gate pulse is applied to the grid of tube 33 and the latter is rendered conductive so that the line 31 is terminated in a short circuit. The coils 30 positioned at even multiples of quarter wavelength intervals from the end, those with $y$ subscripts, are now caused to be energized as the points of current maximum shift to these points. The cathodes of the diodes 43 associated with the $y$ coils are then held at a negative potential. Again considering an input applied to terminal 1, the cathode of diode 44 of each associated And circuit is pulsed negatively through lead 48 and lead 49, however, only the And circuit associated with coil 30—1$y$ is operative with both inputs negative and an output appears on the associated lead 47 and the tens order output terminal. Obviously, signals applied to the terminals 2, 3, etc., may be similarly traced to the order output terminals.

The single transmission line unit illustrated is capable of shifting only one column position, however, an interconnecting Christmas tree circuit with a plurality of such units as that shown in Fig. 1 may be employed to provide column shift to any degree desired.

Figure 4:
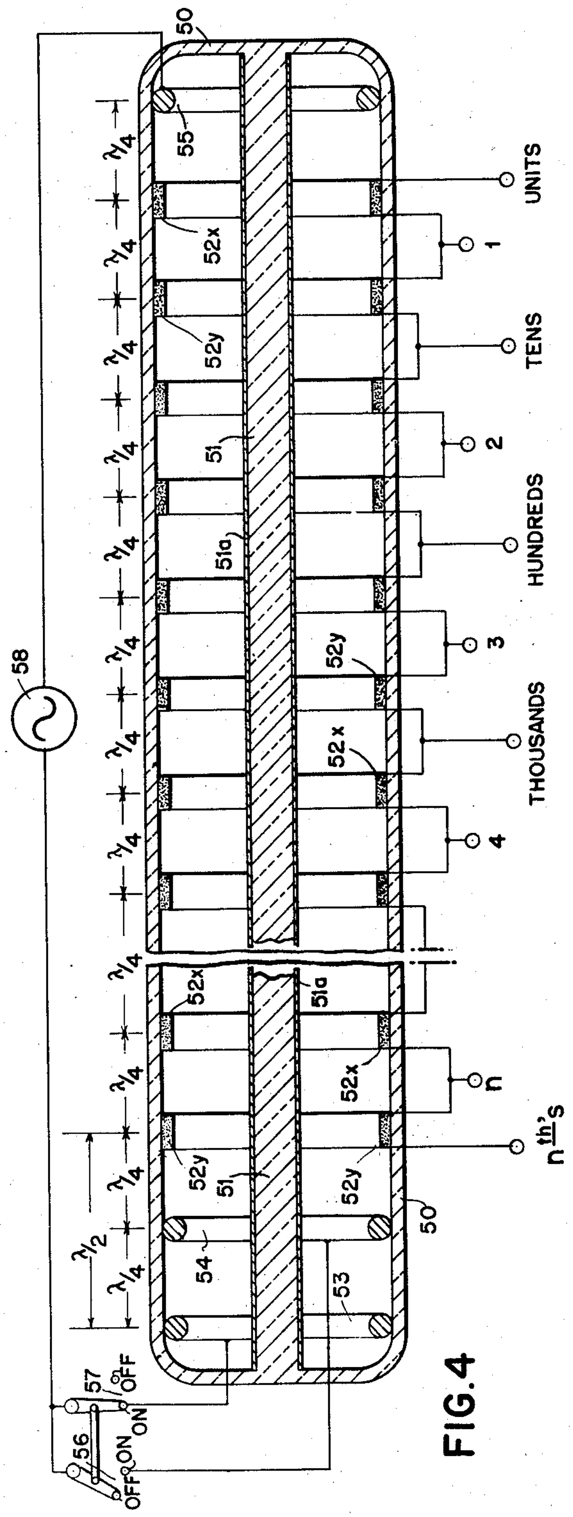
Fig. 4 illustrates still another embodiment of the transfer device and comprises a gas filled glow tube having photo-voltaic or photo-resistive elements placed at quarter wave length intervals along the lengh of the tube.

A photo-electric transfer device is illustrated in Fig. 4 and may also be substituted for the respective transmission line banks illustrated in Fig. 1 to form a transfer arrangement of like character. This species comprises an envelope 50 within which is located an axially positioned rod 51 of glass coated with copper or other similar conductive material 51$a$, however, the rod 51 may be formed of conductive material as desired. Bands 52 of lead sulphide, approximately one quarter inch in width, are positioned at quarter wavelength intervals along the inner surface of the envelope 50. A pair of electrodes 53 and 54 are positioned at one end of the tube and are spaced a distance of one quarter wavelength from one another, and one half and one quarter wavelength respectively from the adjacent lead sulphide band 52. An electrode 55 is positioned at the the opposite end of the tube and spaced a quarter wavelength from the adjacent band 52 at this end. The envelope 50 is filled with a gas or mixture of gases such as neon and sodium vapor so proportioned that, as the mixture is illuminated, a color match is obtained at the corresponding wavelength to which the lead sulphide material is most sensitive. The nodal points of high frequency energy supplied to the tube cause discrete regions in the gas to become ionized and these illuminated layers are shifted in position by alternate employment of the electrodes 53 and 54 in conjunction with electrode 55. Alternate ones of the lead sulphide bands are then located in an illuminated region and, as they are responsive to the wavelength of light developed in these regions, react by evidencing a change in conductivity. It has been determined that a resistivity change of approximately ten to one may be obtained in the sulphide bands under optimum conditions so that in the presence of illumination, the lead sulphide acts as a closed switch while in the non-illuminated regions, it acts as an open switch. Two lead sulphide bands 52 having subscripts $x$ and $y$ are provided for each transfer point and input signals applied to terminals 1, 2, 3 . . . $n$ respectively, pass through one or the other of the bands comprising each pair depending upon the employment of either electrode 53 or 54 in conjunction with electrode 55 at the opposite end of the tube. Switches 56 and 57 are connected with the electrodes 53 and 54 respectively, and are operated so that one is open while the other is closed. As shown schematically in the figure, these these switches are mechanical devices, however, to provide the speed of operation desired, they may be replaced with electronic devices which are operated in accordance with signals programmed from controlling signal sources within a calculator or other electronic apparatus. Closure of one or the other of the switches couples the output terminals of an oscillator 58 to electrode 56 or 57 and to electrode 55 so that high frequency energy flows through the gas filling of the tube and a standing voltage wave appears at quarter wavelength intervals along its length producing regions of illumination. Considering switch 56 closed and switch 57 open, the radio frequency energy from source 58 is applied to electrodes 53 and 55 and regions of voltage maximum of the standing wave are located adjacent the lead sulphide bands 52 having subscripts $x$. These regions will be illuminated and the resistance of these bands 52 will then be negligible in comparison to that of the bands having $y$ subscripts. An input pulse applied to input terminal 1, for example, then passes through the associated band 52$x$ and appears at the units output terminal. Closure of switch 57 and opening of switch 56 shifts the bands of illumination so that the lead sulphide bands having subscripts $y$ are of lower resistance and an impulse applied to terminal 1 then appears at the tens order output terminal.

Tube units such as the one illustrated may be connected in the same fashion as the transmission line sections shown in Fig. 1 to fabricate a Christmas tree type circuit path and a column shifting arrangement capable of accomplishing a shift of any desired number of order positions as described in connection with that figure may be provided.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. A multiple transfer device comprising in combination, an energy transmission means, a source of alternating energy coupled to said transmission means, a plurality of energy responsive means arranged along said transmission means and effectively displaced from one another a distance equal to a multiple of one quarter wavelength of said alternating energy, circuit means coupled to pairs of adjacent ones of said energy responsive means, and selectively operable means for causing a standing energy wave produced on said transmission means to shift between a first and a second position so as to activate alternate ones of said energy responsive means to provide alternate conductive paths through said circuit means.

2. A multiple transfer device comprising in combination, an energy transmission means having terminals, a source of radio frequency energy connected to said transmission means, a plurality of energy responsive elements effectively displaced along said transmission means and spaced from one another a distance equal to a multiple of quarter wavelengths of said radio frequency energy with the extreme ones of said elements displaced a like distance from the adjacent terminal of said transmission means, circuit means coupled to pairs of adjacent ones of said energy responsive means, and selectively operable means for causing a standing energy wave produced on said transmission line to shift between a first and a second position so as to selectively energize alternate ones of said elements and provide alternate conductive paths through said circuit means.

3. A multiple switching device comprising a coaxial transmission line, an alternating energy source coupled to said line, a plurality of energy responsive means arranged at quarter wavelength intervals along said transmission line, circuit means coupled to said energy responsive means, and means for causing a standing energy wave produced on said transmission line to shift selectively from a first position to a second position so as to activate alternate ones of said energy responsive means.

4. A multi-contact radio frequency actuated transfer relay comprising, a transmission line, a source of exciting radio frequency energy coupled to said line at one end, at least one group of energy responsive devices having connections to said line displaced from one another a distance equal to a quarter wavelength of the exciting frequency, circuit means coupled to said energy responsive devices, and selectively operable means for short circuiting and open circuiting the other end of said line whereby alternate ones of said groups of said energy responsive devices are rendered conductive to provide a conductive path through said circuit means.

5. A multiple transfer device comprising in combination, a transmission line, means for energizing said transmission line comprising a source of radio frequency energy coupled thereto, a plurality of radio frequency actuated diodes having connections to said transmission line displaced from one another a distance equal to a quarter wavelength of the energizing frequency, signal circuit means connected through said diodes, and means for causing a standing wave of energy to shift selectively from a first to a second position so as to actuate alternate ones of said diodes and provide alternate conductive paths through said circuit means.

6. A multiple transfer device comprising in combination, a coaxial transmission line section, means for energizing said line comprising a source of radio frequency energy coupled thereto at one end of the section, a plurality of radio frequency actuated diodes having connections to said line displaced from one another a distance equal to multiples of a quarter wavelength of said energizing source and with the diodes at the extreme positions of said plurality of diodes arranged a like distance from the adjacent end of said transmission line section, circuit means coupled to said diodes, and means for causing a standing wave of energy to shift from a first to a second position so as to actuate alternate ones of said diodes and provide alternate paths through said circuit means, said means for shifting the standing wave including a device adapted to selectively short and open circuit the other end of said transmission line section.

7. A multiple transfer device comprising in combination, a coaxial transmission line section, a source of radio frequency energy coupled to said section at one end thereof, a plurality of radio frequency actuated diodes having connections to said section displaced from one another a distance equal to a multiple of a quarter wavelength of the frequency output of said energizing source and with those diodes occupying terminal positions arranged a like distance from the adjacent end of the section, circuit means coupled to pairs of adjacent ones of said diodes, and means including a thyratron adapted to selectively short and open circuit the other end of said transmission line section whereupon a standing wave of energy is caused to shift from a first to a second position energizing alternate ones of said diodes so as to provide a conductive path through one or the other diode of each of said pairs.

8. A multiple transfer device comprising a coaxial transmission line section, a source of radio frequency energy coupled to one end of said section, a plurality of radio frequency actuated diodes having connections to said section displaced from one another a distance equal to a multiple of a quarter wavelength of the frequency of said energy source and with those diodes at terminal positions arranged a like distance from the adjacent end of the section, means including a thyratron adapted to short or open circuit the other end of said section in response to its state of conductivity so as to shift a standing wave of energy from a first to a second position selectively energizing alternate ones of said diodes, circuit means connecting an electrode of adjacent pairs of said diodes and connections to the remaining electrode of each adjacent pair of diodes.

9. A multiple transfer device comprising in combination, an energy transmission means, a source of alternating energy connected to said transmission means, a plurality of energy responsive devices arranged along said transmission means and displaced from one another a distance equal to a multiple of a quarter wavelength of said alternating energy frequency, selectively operable means for causing a standing energy wave produced on said transmission means to shift from a first to a second position whereupon alternate ones of said energy responsive devices are actuated, and circuit means connected to said energy responsive devices and adapted to direct a signal through alternate ones of said devices in response to shifting of said standing energy wave.

10. A multiple transfer system comprising a gaseous discharge device, a source of alternating frequency energy coupled to said device, a plurality of energy responsive elements arranged along said device and displaced from one another a distance equal to a multiple of one quarter wavelength of said alternating frequency energy, and means for causing a standing wave of energy produced in said discharge device to shift from a first to a second position so as to activate alternate ones of said elements.

11. A multiple transfer device comprising a gaseous discharge tube, electrodes arranged at each end of said tube, a source of radio frequency energy coupled to said electrodes, a plurality of energy responsive elements arranged along the length of said tube and displaced from one another and from said electrodes a distance equal to a multiple of a quarter wavelength of said radio frequency, means for causing a standing wave of energy produced in said discharge tube to selectively shift from a first position to a second position whereupon alternate ones of said elements are activated.

12. Apparatus as set forth in claim 11 wherein said energy responsive elements comprise lead sulphide bands.

13. A multiple transfer device comprising a gaseous discharge tube, electrodes arranged at each end of said tube, a source of radio frequency energy coupled to said electrodes, a plurality of lead sulphide bands displaced from one another a distance equal to a multiple of a quarter wavelength of said radio frequency energy with the extreme ones of said bands displaced a like distance from the adjacent electrode, circuit means connected to said bands and adapted to direct a signal through alternate ones of said bands in response to activation thereof, and means for causing a standing wave of energy produced in said discharge tube to selectively shift from a first to a second position whereupon alternate ones of said lead sulphide bands are activated.

14. A multiple transfer device comprising in combination, an energy transmission means, a source of alternating energy coupled to said transmission means, a plurality of windings arranged along said transmission means and effectively displaced from one another a distance equal to a multiple of one quarter wavelength of said alternating energy, a plurality of And circuits having input and output terminals, circuit means individually coupled to said windings and one input terminal of an associated And circuit, a plurality of signal circuits individually coupled to another input of adjacent pairs of said And circuits, and means for causing a standing energy wave produced on said transmission means to shift selectively from a first to a second position whereby selected ones of said And circuits are operable to produce an output pulse.

15. A multiple transfer device comprising in combination, an energy transmission means, a source of radio frequency energy coupled to said transmission means, a plurality of windings arranged along said transmission means and effectively displaced from one another a distance equal to a multiple of one quarter wavelength of said radio frequency energy and with extreme ones of said windings displaced a like distance from the adjacent terminal of said transmission means, a plurality of diode And circuits having input and output terminals, coupling means including a radio frequency transformer connecting each of said windings and providing an input to one of said And circuits, a plurality of signal circuits individually connected to another input of adjacent pairs of said And circuits, and means for causing a standing energy wave produced on said transmission means to selectively shift from one to another position whereby selected ones of said windings are energized.

16. A multiple transfer device comprising, a plurality of input terminals, a plurality of output terminals, an energy transmission medium, means for producing a standing wave of electrical energy along said transmission medium, means for alternately and selectively shifting said energy wave along said medium and means responsive to the position of said standing energy wave to couple said input terminals individually to particular ones of said output terminals.

17. A column shift system comprising a plurality of energy transmission means, a source of alternating energy coupled to said transmission means, a plurality of energy responsive elements arranged along each of said transmission means and effectively displaced from one another a distance equal to a multiple of a quarter wavelength of said alternating frequency, means for causing a standing wave of energy produced on each of said transmission means to selectively shift from a first to a second position so as to activate alternate ones of said elements, circuit means interconnecting said elements and adapted to direct a signal through selected ones of said elements of one or more of said transmission means so as to cause a signal to selectively appear at any one of a plurality of output terminals.

18. Apparatus as set forth in claim 17 wherein said transmission means comprise coaxial transmission line sections.

19. Apparatus as set forth in claim 18 wherein said energy responsive elements comprise radio frequency actuated gas diodes.

20. Apparatus as set forth in claim 17 wherein said transmission means comprise gaseous discharge devices.

21. Apparatus as set forth in claim 20 wherein said energy responsive elements comprise light sensitive devices.

22. Apparatus as set forth in claim 21 wherein said light sensitive devices comprise lead sulphide bands.

23. Apparatus as set forth in claim 17 wherein said energy responsive elements comprise current sensitive means.

References Cited in the file of this patent

UNITED STATES PATENTS

| | | |
|---|---|---|
| 2,304,015 | Peterson et al. | Dec. 1, 1942 |
| 2,414,541 | Madsen | Jan. 21, 1947 |
| 2,498,720 | Wild et al. | Feb. 28, 1950 |
| 2,577,141 | Mauchly et al. | Dec. 4, 1951 |
| 2,631,232 | Baracket | Mar. 10, 1953 |
| 2,655,605 | Hartley | Oct. 13, 1953 |